United States Patent
Adachi et al.

(10) Patent No.: US 7,248,644 B2
(45) Date of Patent: Jul. 24, 2007

(54) CIRCUIT AND METHOD FOR COMPENSATING FOR NONLINER DISTORTION OF POWER AMPLIFIER

(75) Inventors: Takahiro Adachi, Tokyo (JP); Masahiro Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 712 days.

(21) Appl. No.: 10/774,462

(22) Filed: Feb. 10, 2004

(65) Prior Publication Data

US 2004/0164798 A1 Aug. 26, 2004

(30) Foreign Application Priority Data

Feb. 21, 2003 (JP) ............................. 2003-044199

(51) Int. Cl.
*H04L 25/49* (2006.01)
*H03K 7/00* (2006.01)
(52) U.S. Cl. ........................ 375/296; 375/297; 332/107
(58) Field of Classification Search ......... 375/295–297; 332/106, 107, 125, 103, 159
See application file for complete search history.

(56) References Cited

U.S. PATENT DOCUMENTS

| 6,373,902 | B1 * | 4/2002 | Park et al. ................... 375/296 |
| 6,587,513 | B1 * | 7/2003 | Ichihara ....................... 375/296 |
| 6,798,843 | B1 * | 9/2004 | Wright et al. ................ 375/296 |
| 6,973,141 | B1 * | 12/2005 | Isaksen et al. ............... 375/308 |
| 2002/0136324 | A1 * | 9/2002 | Nagasaka ..................... 375/296 |

FOREIGN PATENT DOCUMENTS

| JP | 10-322137 | 12/1998 |
| JP | 2000-228643 | 8/2000 |
| JP | 2001-53627 | 2/2001 |
| JP | 2001-203539 | 7/2001 |
| JP | 2001-274851 | 10/2001 |
| JP | 2002-299966 | 10/2002 |

* cited by examiner

*Primary Examiner*—Tesfaldet Bocure
(74) *Attorney, Agent, or Firm*—Young & Thompson

(57) ABSTRACT

A nonlinear distortion compensating circuit for compensating for a nonlinear distortion caused by a power amplifier for amplifying an input signal has a power calculator for calculating a power value of the input signal, an operating point setting unit for calculating an apparent power value from temperature information, supplied from an external source, representative of the measured temperature of the power amplifier and the power value calculated by the power calculator, based on a relationship, given beforehand to the operating point setting unit, between input vs. output characteristics of the power amplifier and the temperature of the power amplifier, an inverse characteristics calculator for calculating an inversion of the nonlinear distortion from inverse characteristics data, given beforehand to the inverse characteristics calculator, and a complex multiplier for adding the inversion calculated by the inverse characteristics calculator to the input signal.

6 Claims, 4 Drawing Sheets

CIRCUIT AND METHOD FOR COMPENSATING FOR NONLINER DISTORTION OF POWER AMPLIFIER

BACKGROUND OF THE INVENTION

1. Field of the Invention

The present invention relates to a circuit and a method for compensating for a nonlinear distortion of a power amplifier, and more particularly to a transmitting circuit having a nonlinear distortion compensating circuit.

2. Description of the Related Art

Digital microwave radio communication systems generally employ a quadrature amplitude modulation format such as a multilevel quadrature amplitude modulation format from the standpoint of frequency utilization efficiency. According to the quadrature amplitude modulation format, since a power amplifier for amplifying a transmission signal uses only a linear region of its input vs. output characteristics, it is desirable to have a sufficiently large backoff (which represents an operating point and is generally given as the difference between a maximum output amplitude level and a saturated output power level). If the backoff is large, however, a sufficiently large amount of transmission power cannot be obtained. Actually, therefore, it is necessary to reduce the backoff for the power amplifier to use a nonlinear region of its input vs. output characteristics. As a result, a problem arises in that a nonlinear distortion caused when the power amplifier uses the nonlinear region is added to a transmission signal.

To solve the above problem, there has been devised a process of compensating for a nonlinear distortion produced when a transmission signal is amplified by adding an inversion of the nonlinear distortion depending on the power of an input signal to the transmission signal using a circuit referred to as a predistorter. Heretofore, such predistorters comprise an analog circuit for use in the RF band. However, the conventional predistorters suffer limitations on their compensation accuracy on account of their component variations, and are difficult to make adjustments. In recent years, the advance of digital signal processing technologies has led to predistorters that are constructed as baseband digital circuits.

Transmission circuits using digital predistorters are generally classified into two types, i.e., open-loop transmission circuits and closed-loop transmission circuits. FIG. 1 of the accompanying drawings shows a typical open-loop transmission circuit arrangement (see patent document 1 (Japanese laid-open patent publication No. 2001-53627)), and FIG. 2 of the accompanying drawings shows a typical closed-loop transmission circuit arrangement (see patent document 2 (Japanese laid-open patent publication No. 2000-228643)).

The open-loop transmission circuit shown in FIG. 1 comprises FIR filter 10, predistorter 11, modulator 12, and power amplifier 13 which are connected in series. An input baseband digital signal (Ich DATA, Qch DATA) is supplied through FIR filter 10 and predistorter 11 to modulator 12, which performs quadrature amplitude modulation on the signal. The modulated signal is then amplified by power amplifier 13. Inverse characteristics of the nonlinear distortion of power amplifier 13 are determined in advance and held in predistorter 11 to determine a compensation value with respect to the power level of the input signal. The circuit arrangement shown in FIG. 1 is advantageous in that it is simple and inexpensive. However, since the inverse characteristics held in predistorter 11 are of fixed nature, if the inverse characteristics held in predistorter 11 and the actual inverse characteristics are different from each other for some reason, then the open-loop transmission circuit fails to provide a sufficient nonlinear distortion compensating capability.

The closed-loop transmission circuit shown in FIG. 2 differs from the open-loop transmission circuit shown in FIG. 1 in that it has adaptive predistorter 14 in place of predistorter 11 shown in FIG. 1, and additionally has comparison/control circuit 15 and demodulator 16. In operation, the modulated signal that is amplified by power amplifier 13 is demodulated by demodulator 16. Comparison/control circuit 15 compares the baseband digital signal (Ich DATA, Qch DATA) output from FIR filter 10 and the demodulated signal from demodulator 16 with each other, and adaptively changes the amount of compensation in adaptive predistorter 14 in order to equalize the baseband digital signal and the demodulated signal to each other. Adaptive predistorter 14 can thus compensate for the nonlinear distortion optimally at all times.

It is generally known that the input vs. output characteristics of the power amplifier vary with the operating temperature thereof. With the open-loop arrangement, since the amount of compensation is determined based on only the power of the input signal, as described above, if the temperature of the power amplifier changes, then the amount of compensation and the actual inverse characteristics become different from each other, resulting in an in sufficient nonlinear distortion compensating capability. The closed-loop arrangement is free of the above drawback because characteristic changes due to changes in the temperature of the power amplifier are adaptively compensated for. However, the closed-loop transmission circuit is much more complex in circuit arrangement and costly than the open-loop transmission circuit because the closed-loop transmission circuit requires the demodulator. Accordingly, it is desirable from the standpoint of simpler and less costly circuit arrangements to be able to achieve temperature compensation in the open-loop transmission circuit.

According to one conventional process of achieving temperature compensation in the open-loop transmission circuit, a plurality of compensatory values corresponding to a plurality of temperatures are stored in a table, and a predistorter acquires a compensatory value depending on the operating temperature of a power amplifier from the table (see patent document 3 (Japanese laid-open patent publication No. 2001-274851)).

With the arrangement disclosed in patent document 3 referred to above, it is necessary to store temperatures at small intervals in the table for providing an exact match between a compensatory value retrieved from the table and the amount of a nonlinear distortion produced in the power amplifier at the actual operating temperature. However, storing temperatures at small intervals in the table requires that a memory which holds the table be larger in circuit scale and hence more expensive. For this reason, the arrangement disclosed in patent document 3 has to store temperatures at certain compromising intervals in the table. Consequently, it is difficult even for the arrangement disclosed in patent document 3 to achieve an exact match between a retrieved compensatory value and the amount of a nonlinear distortion produced at the actual operating temperature, and to provide a sufficient temperature compensating capability.

SUMMARY OF THE INVENTION

It is therefore an object of the present invention to provide a circuit and a method for compensating for a nonlinear distortion of a power amplifier accurately at an actual operating temperature of the power amplifier without an undue increase caused in the circuit scale and cost.

Another object of the present invention is to provide a transmitting circuit having a nonlinear distortion compensating circuit.

To achieve the above objects, there is provided in accordance with the present invention a nonlinear distortion compensating circuit comprising a power calculator for calculating a power value of an input signal, an operating point setting unit for calculating an apparent power value from temperature information, supplied from an external source, representative of the measured temperature of a power amplifier for amplifying the input signal and the power value calculated by the power calculator, based on a relationship, which has been given beforehand to the operating point setting unit, between input vs. output characteristics of the power amplifier and the temperature of the power amplifier, an inverse characteristics calculator for calculating an inversion of a nonlinear distortion caused by the power amplifier from inverse characteristics data, which have been given beforehand to the inverse characteristics calculator, about the nonlinear distortion caused by the power amplifier and the apparent power value calculated by the operating point setting unit, and a complex multiplier for adding the inversion calculated by the inverse characteristics calculator to the input signal.

The nonlinear distortion compensating circuit according to the present invention is based on the fact that the input vs. output characteristics of the power amplifier are substantially translated as the temperature thereof changes. The operating point setting unit uniquely calculates apparent power value Pin' from power value Pin of the input signal and the temperature information of the power amplifier based on the temperature dependency of the input vs. output characteristics of the power amplifier. The inverse characteristics calculator calculates an inversion of the nonlinear distortion caused by the power amplifier, which corresponds to the apparent power value Pin' input from the operating point setting unit, and the complex multiplier adds the inversion calculated by the inverse characteristics calculator to the input signal. The inversion (an amount of compensation) thus added is in exact conformity with the actual nonlinear distortion caused by the power amplifier.

A transmission circuit according to the present invention includes the above nonlinear distortion compensating circuit, a modulator for modulating a signal output from the nonlinear distortion compensating circuit, a power amplifier for amplifying a modulated signal output from the modulator, and a thermometer for measuring a temperature of the power amplifier and supplying temperature information representative of the measured temperature to the nonlinear distortion compensating circuit. The transmission circuit thus arranged is capable of performing the function of the nonlinear distortion compensating circuit described above.

A method of compensating for a nonlinear distortion according to the present invention comprises the steps of (a) calculating a power value of an input signal, (b) measuring a temperature of a power amplifier for amplifying the input signal, (c) calculating an apparent power value from the power value calculated in the step (a) and the temperature measured in the step (b) based on a relationship, which has been given beforehand, between input vs. output characteristics of the power amplifier and the temperature of the power amplifier, (d) calculating an inversion of a nonlinear distortion caused by the power amplifier from inverse characteristics data, which have been given beforehand, about the nonlinear distortion caused by the power amplifier and the apparent power value calculated in the step (c), and (e) adding the inversion calculated in step (d) to the input signal. The method is also capable of performing the function of the nonlinear distortion compensating circuit described above.

According to the present invention, there is no need for a table of different compensatory values at respective temperatures, like the one used in the conventional predistorter. Therefore, the nonlinear distortion compensating circuit may be reduced in circuit scale and cost.

When the temperature of the power amplifier changes, the inversion (an amount of compensation) added to the input signal is in exact conformity with the actual nonlinear distortion of the power amplifier. Consequently, the nonlinear distortion can be compensated for more accurately than heretofore.

The above and other objects, features, and advantages of the present invention will become apparent from the following description with reference to the accompanying drawings which illustrate examples of the present invention.

DESCRIPTION OF THE PREFERRED EMBODIMENT

An embodiment of the present invention will be described below with reference to the accompanying drawings.

Figure 1:
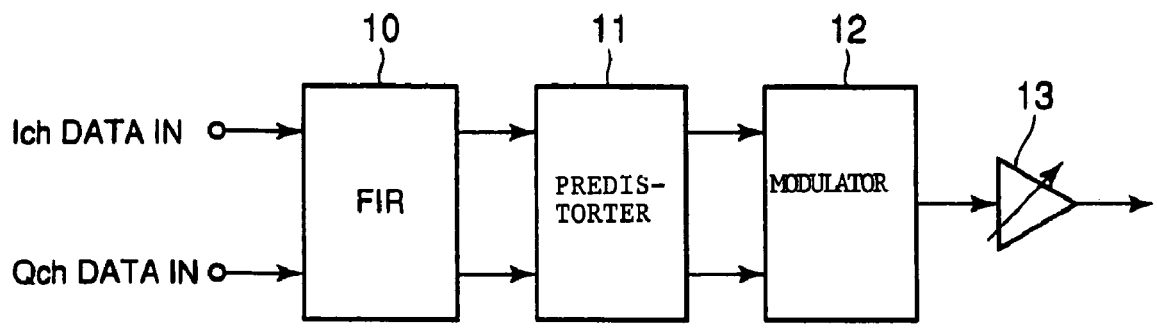
FIG. 1 is a block diagram of a typical open-loop transmission circuit.
Figure 2:
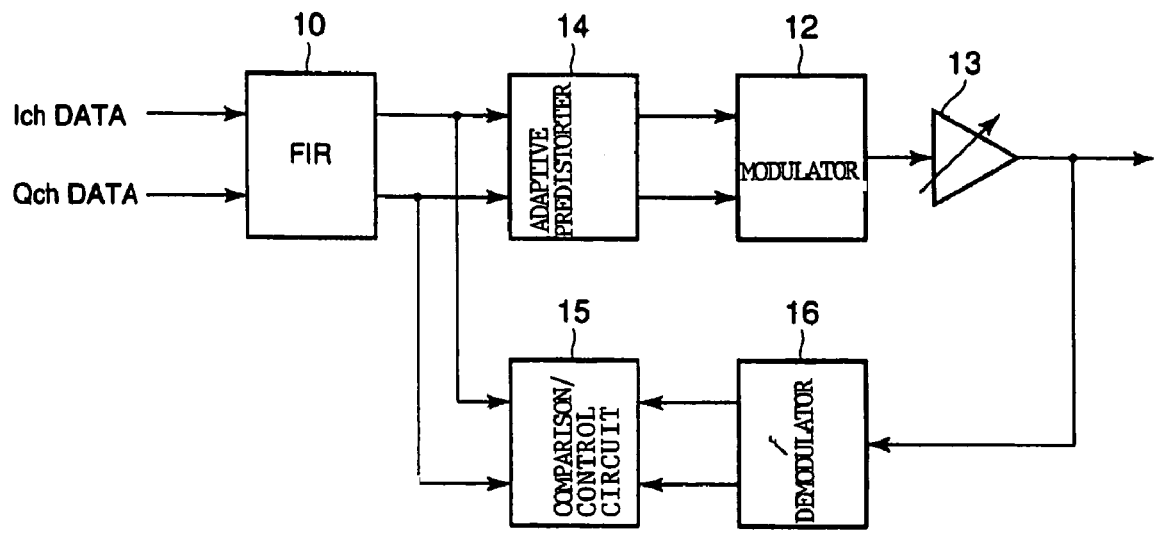
FIG. 2 is a block diagram of a typical closed-loop transmission circuit.
Figure 3:
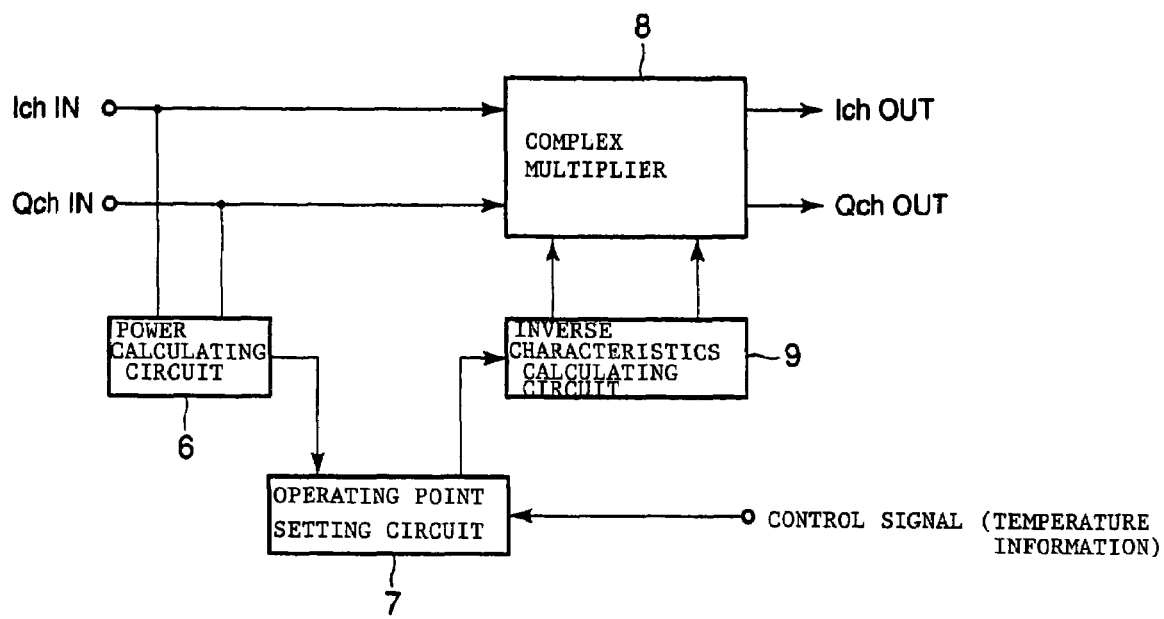
FIG. 3 is a block diagram of a schematic arrangement of a digital predistorter with a temperature compensating function according to an embodiment of the present invention.
Figure 4:
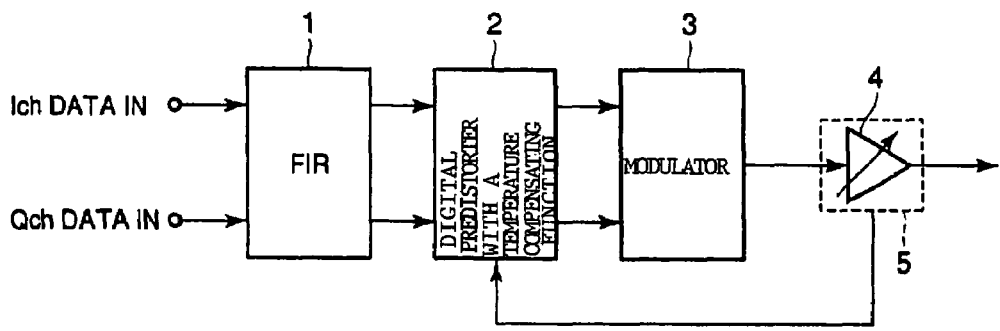
FIG. 4 is a block diagram of a schematic arrangement of a transmission circuit which incorporates the digital predistorter with the temperature compensating function shown in FIG. 3.

FIG. 3 shows in block form a schematic arrangement of a digital predistorter with a temperature compensating function according to an embodiment of the present invention, and FIG. 4 shows in block form a schematic arrangement of a transmission circuit which incorporates the digital predistorter with the temperature compensating function shown in FIG. 3.

First, the transmission circuit shown in FIG. 4 will be described below. The transmission circuit is a circuit for use in a digital microwave radio communication systems, and comprises FIR (Finite Impulse Response) filter 1, digital predistorter 2 with a temperature compensating function, modulator 3, power amplifier 4, and thermometer 5. It is assumed that the transmission circuit is supplied with an input signal in a quadrature amplitude modulation format such as a multilevel quadrature amplitude modulation format.

FIR filter 1 has an input terminal supplied with baseband digital signal (Ich DATA) and another input terminal supplied with baseband digital signal (Qch DATA), and limits the bands of these baseband digital signals (I/Qch DATA). Outputs (I/Qch DATA) of FIR filter 1 are supplied to digital predistorter 2 with the temperature compensating function. The baseband digital signal (Ich DATA) comprises a string of numerical values of the real part (corresponding to I axis) and the baseband digital signal (Qch DATA) comprises a string of numerical values of the imaginary part (corresponding to Q axis).

Digital predistorter 2 with the temperature compensating function adds an inversion of a nonlinear distortion caused by power amplifier 4 to the output baseband digital signals (I/Qch DATA) from FIR filter 1 to compensate for the nonlinear distortion. Digital predistorter 2 with the temperature compensating function can change the amount of compensation depending on a change in the input vs. output characteristics of power amplifier 4 due to a change in the operating temperature thereof, based on temperature information input from thermometer 5.

Modulator 3 is supplied with the baseband digital signals (I/Qch DATA), which have been compensated for the nonlinear distortion, from digital predistorter 2 with the temperature compensating function, and outputs a modulated signal (transmission signal) that is produced by effecting quadrature amplitude modulation on the supplied baseband digital signals (I/Qch DATA). The modulated signal output from modulator 3 is supplied to power amplifier 4.

Power amplifier 4, which amplifies the modulated signal input from modulator 3, is capable of automatically controlling the level of the input signal such that its average output level will be constant. Thermometer 5 measures the operating temperature of power amplifier 4, and supplies the measured operating temperature as the temperature information to digital predistorter 2 with the temperature compensating function.

With the above transmission circuit, even when the input vs. output characteristics of power amplifier 4 change due to a temperature change, digital predistorter 2 with the temperature compensating function provides a high nonlinear distortion compensating capability.

Specific details of digital predistorter 2 with the temperature compensating function will be described below with reference to FIG. 3.

As shown in FIG. 3, digital predistorter 2 with the temperature compensating function comprises power calculating circuit 6, operating point setting circuit 7, complex multiplier 8, and inverse characteristics calculating circuit 9. Power calculating circuit 6 calculates power P of the baseband digital signals (I/Qch DATA) input from FIR filter 1 according to the equation shown below, and supplies calculated power P to operating point setting circuit 7.

$$P=I^2+Q^2$$

Operating point setting circuit 7 has been given data about the relationship between the input vs. output characteristics of power amplifier 4 and the temperature thereof. Operating point setting circuit 7 calculates apparent power value P' from power value P input from power calculating circuit 6 and the temperature information from thermometer 5, and supplies calculated power value P' to inverse characteristics calculating circuit 9. Apparent power value P' changes depending on the operating temperature of power amplifier 4.

Inverse characteristics calculating circuit 9 holds inverse characteristic data of the nonlinear distortion of power amplifier 4. Inverse characteristics calculating circuit 9 calculates a phase rotation and a gain which correspond to the inversion of the nonlinear distortion from the inverse characteristic data and the apparent power value P' input from operating point setting circuit 7, and supplies their real- and imaginary-part components to complex multiplier 8.

Complex multiplier 8 effects a complex multiplication on the baseband digital signals (i/Qch DATA) input from FIR filter 1 and the inversion of the nonlinear distortion input Inverse characteristics calculating circuit 9. Thus, the inversion of the nonlinear distortion of power amplifier 4 is added to the baseband digital signals (I/Qch DATA) input from FIR filter 1. Complex multiplier 8 supplies its output to modulator 3.

Principles of operation of digital predistorter 2 with the temperature compensating function for compensating for the nonlinear distortion will be described below.

Figure 5:
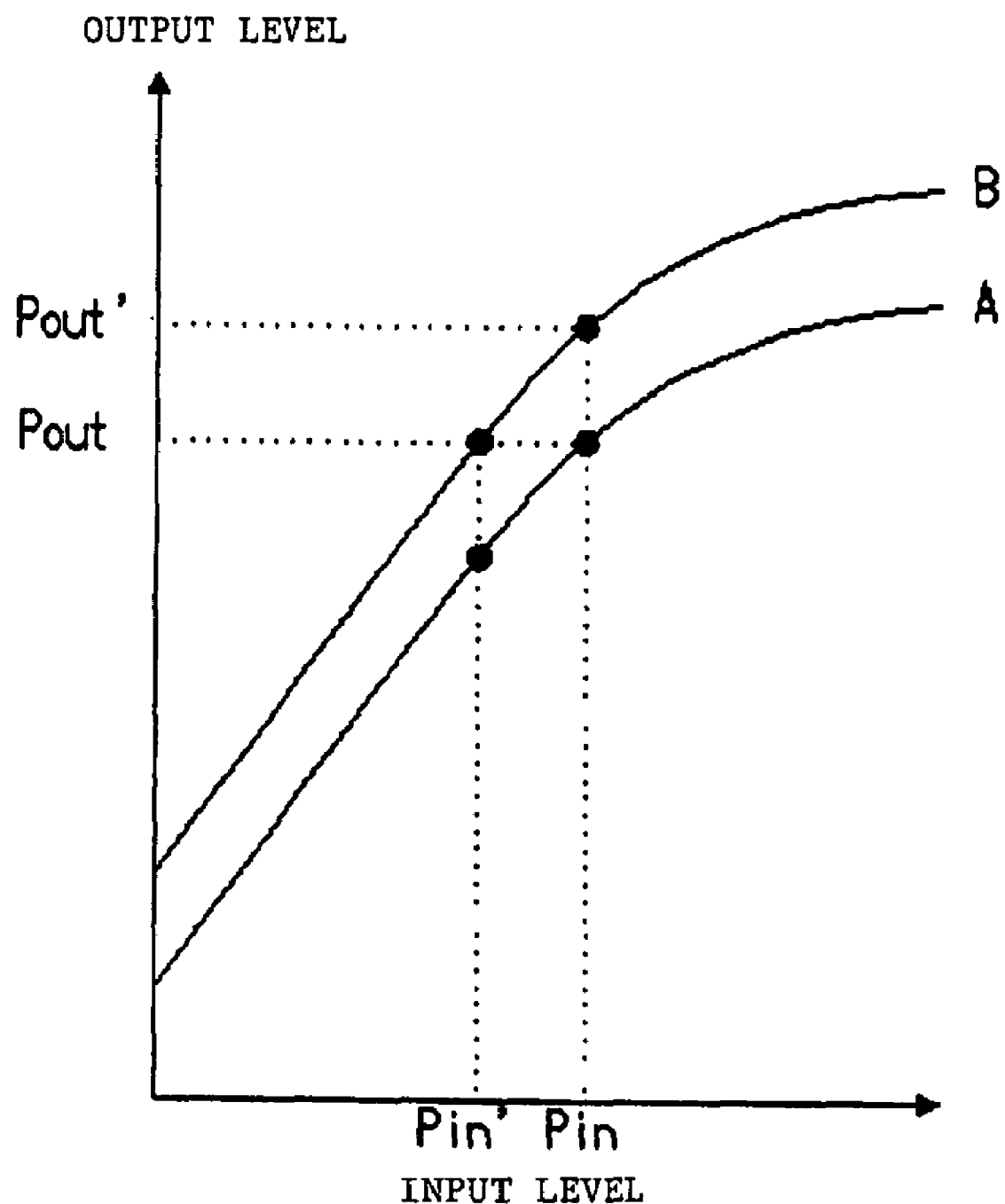
FIG. 5 is a diagram showing how the operating point of a power amplifier changes due to a temperature change thereof in the input vs. output characteristics of the power amplifier.

Generally, the input vs. output characteristics of power amplifier 4 change depending on its operating temperature. FIG. 5 schematically illustrates how the operating point of power amplifier 4 changes due to a temperature change thereof. In FIG. 5, input vs. output characteristic curve A represents the input vs. output characteristics of power amplifier 4 at the temperature for which the amount of compensation (inverse characteristics) is held in the predistorter, and input vs. output characteristic curve B represents the input vs. output characteristics (shifted from input vs. output characteristics A) of power amplifier 4 at the actual temperature.

According to input vs. output characteristics B, when the input level is Pin, the output level is Pout'. Power amplifier 4 has a function to keep output level Pout constant, and attenuates the input signal to Pin' to produce output level Pout. This means that the actual operating point of power amplifier 4 is a point where input level Pin' and input vs. output characteristics B intersect with each other. In such operation of power amplifier 4, when the predistorter adds an amount of compensation for input level Pin directly to the input signal of power amplifier 4, there arises a problem in that the amount of compensation and the actual amount of nonlinear distortion caused by power amplifier 4 differ from each other. Digital predistorter 2 with the temperature compensating function according to the present embodiment solves the above problem according to the following compensating process:

It can be seen from FIG. 5 that the input vs. output characteristics of power amplifier 4 are substantially translated as the temperature thereof changes. When the operating temperature of power amplifier 4 changes, operating point setting circuit 7 can uniquely calculate apparent power value Pin' from power value Pin of the input signal and the temperature information from thermometer 5 based on the temperature dependency of the input vs. output characteristics of power amplifier 4. Inverse characteristics calculating circuit 9, which holds the inverse characteristic data of the nonlinear distortion of power amplifier 4, can calculate a phase rotation and a gain which correspond to the inversion of the nonlinear distortion caused by power amplifier 4, depending on apparent power value Pin' that is input from operating point setting circuit 7.

With digital predistorter 2 with the temperature compensating function, as described above, inverse characteristics calculating circuit 9 does not calculate an amount of compensation for power level Pin, but calculate an amount of compensation for power level Pin'. Therefore, digital predistorter 2 is capable of compensating for a nonlinear distortion depending on the actual operating point of power amplifier 4. Since digital predistorter 2 does not require a table of temperature data like the one used in the conventional predistorter for calculating an amount of compensation, any increase in the circuit scale of digital predistorter 2 is small.

With the transmission circuit shown in FIG. 4, digital predistorter 2 with the temperature compensating function compensates for a nonlinear distortion of the output of power amplifier 4 by adding the inversion of the nonlinear distortion caused by power amplifier 4 to the baseband digital signal input to modulator 3. The signal output from digital predistorter 2 is supplied to modulator 3, which performs quadrature amplitude modulation on the signal. The modulated signal is then supplied to power amplifier 4, which amplifies the modulated signal. Since the inverse characteristics depending on the operating temperature of power amplifier 4 have been added to the modulated signal, power amplifier 4 can produce an output signal which is free of the nonlinear distortion.

Specific details of complex multiplier 8 and modulator 3 will be described below with reference to FIG. 6.

Figure 6:
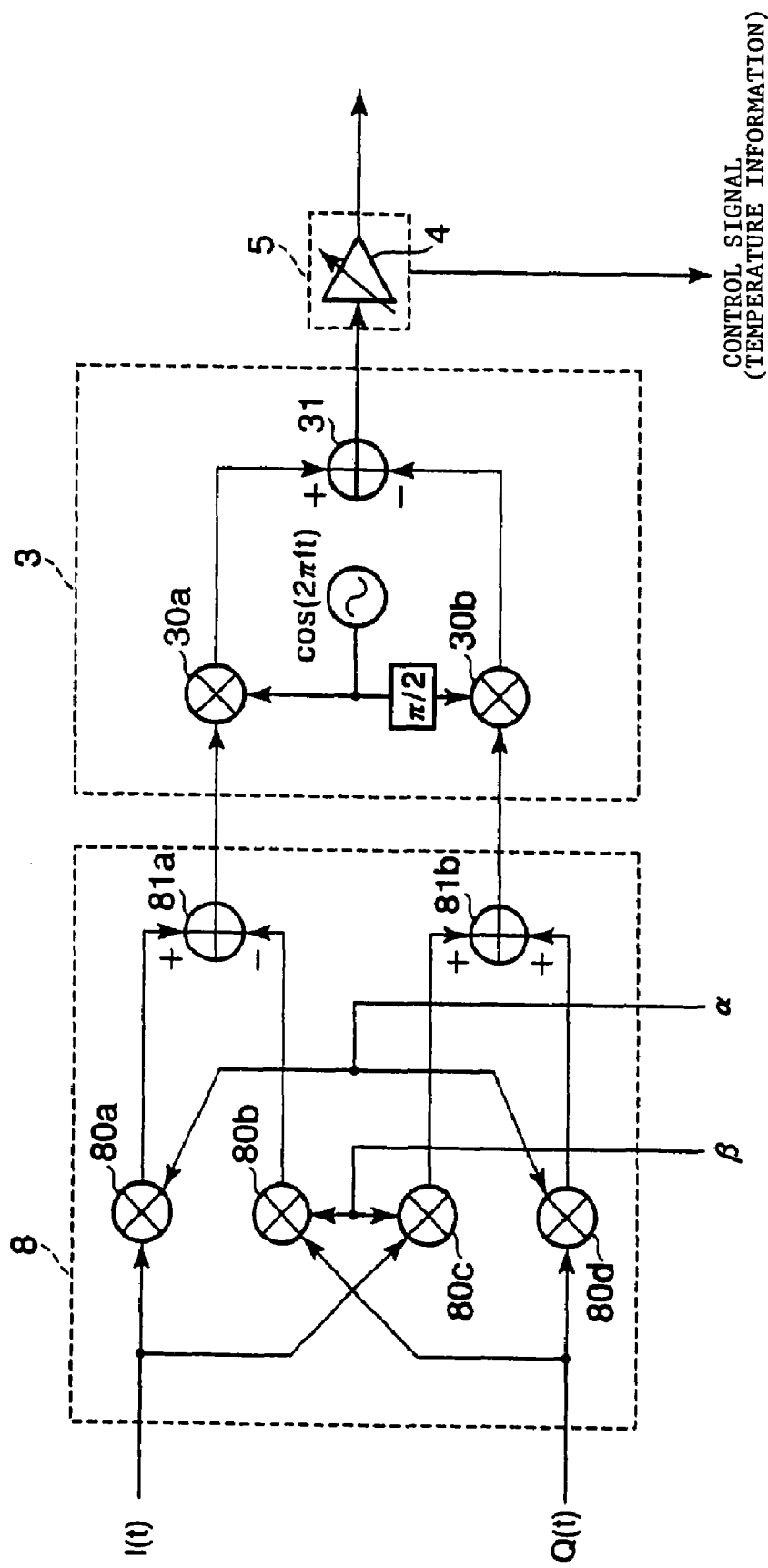
FIG. 6 is a block diagram of an arrangement of a complex multiplier of the digital predistorter with the temperature compensating function shown in FIG. 3 and a modulator shown in FIG. 4.

As shown in FIG. 6, complex multiplier 8 comprises four multipliers 80a through 80d and two adders 81a, 81b. Multipliers 80a, 80c have respective input terminals supplied with a signal I(t) corresponding to the baseband digital signal (Ich DATA) from FIR filter 1, and multipliers 80b, 80d have respective input terminals supplied with a signal Q(t) corresponding to the baseband digital signal (Qch DATA) from FIR filter 1. Multipliers 80a, 80d have respective other input terminals supplied with real part α of the compensatory value depending on the apparent power value from inverse characteristics calculating circuit 9, and Multipliers 80b, 80c have respective other input terminals supplied with imaginary part β of the compensatory value depending on the apparent power value from inverse characteristics calculating circuit 9. Adder 81a has input terminal A ("+" terminal) supplied with an output from multiplier 80a and another input terminal B ("−" terminal) supplied with an output from multiplier 80b, and outputs the sum (A−B) of the supplied inputs to modulator 3. Adder 81b has input terminal A supplied with an output from multiplier 80c and another input terminal B supplied with an output from multiplier 80d, and outputs the sum (A+B) of the supplied inputs to modulator 3.

As shown in FIG. 6, modulator 3, which is a quadrature modulator, comprises two multipliers 30a, 30b and one adder 31. Multiplier 30a has an input terminal supplied with the output from adder 81a and another input terminal supplied with carrier signal $\cos(2\pi ft)$, and multiplies the supplied inputs. Multiplier 30b has an input terminal supplied with the output from adder 81b and another input terminal supplied with a carrier signal, which is delayed from carrier signal $\cos(2\pi ft)$ by $\pi/2$, and multiplies the supplied inputs. Adder 31 has input terminal A ("+" terminal) supplied with an output from multiplier 30a and another input terminal B ("−" terminal) supplied with an output from multiplier 30b, and outputs the sum (A−B) of the supplied signals to power amplifier 4.

In the embodiment described above, the input signal is in a quadrature amplitude modulation format such as a multi-level quadrature amplitude modulation format. However, the present invention is not limited to such a modulation format, but is applicable to any modulation types insofar as the circuit according to the present invention adds the nonlinear distortion of the power amplifier to the transmission signal.

While a preferred embodiment of the present invention has been described using specific terms, such description is for illustrative purposes only, and it is to be understood that changes and variations may be made without departing from the spirit or scope of the following claims.

What is claimed is:

1. A nonlinear distortion compensating circuit comprising:
   a power calculator for calculating a power value of an input signal;
   an operating point setting unit for calculating an apparent power value from temperature information, supplied from an external source, representative of the measured temperature of a power amplifier for amplifying the input signal and the power value calculated by said power calculator, based on a relationship, which has been given beforehand to said operating point setting unit, between input vs. output characteristics of the power amplifier and the temperature of the power amplifier;
   an inverse characteristics calculator for calculating an inversion of a nonlinear distortion caused by the power amplifier from inverse characteristics data, which have been given beforehand to said inverse characteristics calculator, about the nonlinear distortion caused by the power amplifier and the apparent power value calculated by said operating point setting unit; and
   a complex multiplier for adding the inversion calculated by said inverse characteristics calculator to said input signal.

2. A nonlinear distortion compensating circuit according to claim 1, wherein said input signal comprises a modulated signal produced by performing quadrature amplitude modulation on a first baseband signal comprising a string of real numerical values and a second baseband signal comprising a string of imaginary numerical values, and wherein said power calculator calculates said power value from said first and second baseband signals, said inverse characteristics calculator supplies real and imaginary parts of the inversion of the nonlinear distortion to said complex multiplier, and said complex multiplier effects a complex multiplication on said first and second baseband signals and the real and imaginary parts supplied from said inverse characteristics calculator.

3. A transmission circuit comprising:
   a nonlinear distortion compensating circuit according to claim 1;
   a modulator for modulating a signal output from said nonlinear distortion compensating circuit;
   a power amplifier for amplifying a modulated signal output from said modulator; and
   a thermometer for measuring a temperature of said power amplifier and supplying temperature information representative of the measured temperature to said nonlinear distortion compensating circuit.

4. A transmission circuit according to claim 3, wherein said modulator comprises a modulator for performing a quadrature amplitude modulation format.

5. A method of compensating for a nonlinear distortion, comprising the steps of:
   (a) calculating a power value of an input signal;
   (b) measuring a temperature of a power amplifier for amplifying said input signal;

(c) calculating an apparent power value from the power value calculated in said step (a) and the temperature measured in said step (b) based on a relationship, which has been given beforehand, between input vs. output characteristics of the power amplifier and the temperature of the power amplifier;

(d) calculating an inversion of a nonlinear distortion caused by the power amplifier from inverse characteristics data, which have been given beforehand, about the nonlinear distortion caused by the power amplifier and the apparent power value calculated in said step (c); and (e) adding the inversion calculated in step (d) to said input signal.

6. A method according to claim 5, wherein said input signal comprises a modulated signal produced by performing quadrature amplitude modulation on a first baseband signal comprising a string of real numerical values and a second baseband signal comprising a string of imaginary numerical values, and wherein said step (a) comprises the step of calculating said power value from said first and second baseband signals, said step (d) comprises the step of calculating real and imaginary parts of the inversion of the nonlinear distortion, and said step (e) comprises the step of effecting a complex multiplication on the said first and second baseband signals and the real and imaginary parts calculated in said step (d).

* * * * *